United States Patent
Nakayama et al.

(10) Patent No.: US 7,859,014 B2
(45) Date of Patent: Dec. 28, 2010

(54) SEMICONDUCTOR DEVICE

(75) Inventors: Tatsuo Nakayama, Tokyo (JP); Hironobu Miyamoto, Tokyo (JP); Yuji Ando, Tokyo (JP); Masaaki Kuzuhara, Tokyo (JP); Yasuhiro Okamoto, Tokyo (JP); Takashi Inoue, Tokyo (JP); Koji Hataya, Tokyo (JP)

(73) Assignee: NEC Corporation, Tokyo (JP)

( * ) Notice: Subject to any disclaimer, the term of this patent is extended or adjusted under 35 U.S.C. 154(b) by 81 days.

(21) Appl. No.: 11/571,290

(22) PCT Filed: Jun. 24, 2005

(86) PCT No.: PCT/JP2005/011623
§ 371 (c)(1),
(2), (4) Date: Dec. 26, 2006

(87) PCT Pub. No.: WO2006/001369
PCT Pub. Date: Jan. 5, 2006

(65) Prior Publication Data
US 2007/0158692 A1    Jul. 12, 2007

(30) Foreign Application Priority Data
Jun. 24, 2004    (JP) .............................. 2004-186673

(51) Int. Cl.
*H01L 29/66*    (2006.01)
(52) U.S. Cl. ..................... 257/192; 257/197; 257/330
(58) Field of Classification Search .................. 257/187, 257/192, 330
See application file for complete search history.

(56) References Cited

U.S. PATENT DOCUMENTS 4,882,289 A * 11/1989 Moriuchi et al. ............ 438/241

(Continued)

FOREIGN PATENT DOCUMENTS

JP    63-087773 A    4/1988

(Continued)

OTHER PUBLICATIONS

V. Adivarahan et al. "Submicron Gate Si3N4/AlGaN/GaN-Metal-Insulator-Semiconductor Heterostructure Field-Effect Transistors", IEEE Electron Device Letters, vol. 24, No. 9, pp. 541 Sep. 2003.

*Primary Examiner*—Bradley K Smith
*Assistant Examiner*—Alexander Belousov
(74) *Attorney, Agent, or Firm*—Sughrue Mion, PLLC

(57) ABSTRACT

The present invention provides a semiconductor device capable of suppressing current collapse, and also of preventing dielectric breakdown voltage and gain from lowering so as to perform high-voltage operation and realize an ideal high output. On a substrate (101), there are formed a buffer layer (102) made of a first GaN-based semiconductor, a carrier traveling layer (103) made of a second GaN-based semiconductor and a carrier supplying layer (104) made of a third GaN-based semiconductor. A recess structure (108) is made by eliminating a part of a first insulation film (107) and a part of the carrier supplying layer (104). Next, a gate insulation film (109) is deposited, and then a gate electrode (110) is formed so as to fill up the recess portion (108) and cover on over an area where the first insulation film (107) remains so that its portion on the drain electrode side is longer than that on the source electrode side. Such a recess structure is employed so as to provide the high-output semiconductor device capable of performing the high-voltage operation.

18 Claims, 3 Drawing Sheets

U.S. PATENT DOCUMENTS

| | | | |
|---|---|---|---|
| 5,399,886 A * | 3/1995 | Hasegawa | 257/192 |
| 6,140,169 A * | 10/2000 | Kawai et al. | 438/197 |
| 6,465,814 B2 * | 10/2002 | Kasahara et al. | 257/192 |
| 6,468,837 B1 * | 10/2002 | Pendharkar et al. | 438/140 |
| 6,483,135 B1 * | 11/2002 | Mizuta et al. | 257/283 |

FOREIGN PATENT DOCUMENTS

| | | |
|---|---|---|
| JP | 05-067785 A | 3/1993 |
| JP | 05-291573 A | 11/1993 |
| JP | 10-223901 A | 8/1998 |
| JP | 2000-012843 A | 1/2000 |
| JP | 2000-174261 A | 6/2000 |
| JP | 2000-174285 A | 6/2000 |
| JP | 2000-252458 A | 9/2000 |
| JP | 2000-294768 A | 10/2000 |
| JP | 2001-308196 A | 11/2001 |
| JP | 2002-324813 A | 11/2002 |

* cited by examiner

SEMICONDUCTOR DEVICE

This application claims priority from PCT Application No. PCT/JP2005/011623 filed Jun. 24, 2005, and from Japanese Patent Application No. 2004-186673 filed Jun. 24, 2004, which applications are incorporated herein by reference.

TECHNICAL FIELD

The present invention relates to a semiconductor device, and in particular, to a semiconductor device capable of high-voltage operation and realizing high output.

BACKGROUND ART

Conventionally, as for an AlGaN/GaN HJFET structure, there has been a report of an MISFET structure in which an insulation film is formed between a source and a drain and then a gate electrode is formed thereon, as it can reduce a gate leak current and increase a positively applied gate bias to render a high current available, and so its application to a high-output use is expected.

For instance, Adivarahan V. et al. reported the structure employing a $Si_3N_4$ film as the insulation film on AlGaN/GaN in IEEE Electron Device Letters, Vol. 24, No. 9, pp. 541 (2003).

FIG. 6 is a sectional view illustrating the structure of a field-effect transistor reported by Adivarahan V. et al. As shown in FIG. 6, Ti/Al/Ti/Au is deposited in layered form as a source electrode 1005 and a drain electrode 1006 after sequentially layering up an AlN layer 1002 of 50-nm film thickness, a GaN layer 1003 of 1.5-μm film thickness and an AlGaN layer 1004 of 25-nm film thickness on a 4H-SiC substrate 1001, and then it is subjected to heat treatment at 850° C. for 1 minute.

Furthermore, after a $Si_3N_4$ film 1007 is laminated over, a gate electrode 1008 made of Ni/Au is formed thereon, and then a protective film 1009 is formed with the $Si_3N_4$ film lastly. Thus, it is possible, by inserting the insulation film between a semiconductor layer and the gate electrode so as to form the MISFET structure, to reduce the gate leak current and increase the positively applicable gate bias, whereby high output operation is attained.

DISCLOSURE OF THE INVENTION

Problem to be Solved by the Invention

In the case of a planar structure, however, there is a problem that if the AlGaN layer is thinned to suppress reduction in gain due to formation of the insulation film as with the conventional technology, sheet resistance increases and the current lowers, and besides, significant current collapse occurs due to a spontaneous polarization effect and a piezoelectric effect of a nitride semiconductor so that an expected output cannot be produced in high-frequency operation.

There is also a problem that if the AlGaN layer is thickened to suppress the current collapse, a distance between the gate electrode and two-dimensional electron gas becomes remote so that the gain is reduced. Furthermore, there is a problem that if the insulation film is thinned to suppress the reduction in gain due to formation of the insulation film because electric fields concentrate on a drain edge of the gate electrode on the insulation film, the insulation is destroyed not only when applying a positive voltage to the gate electrode but also when applying a negative high voltage.

The present invention has been made in view of the problems of the conventional technology, and an object thereof is to provide a semiconductor device capable of reducing the gate leak current and suppressing the current collapse and thereby capable of performing high-voltage operation and realizing high output.

Means for Solving Problem

A semiconductor device according to the present invention is characterized in that:

the semiconductor device is a field-effect transistor made of a III-V nitride semiconductor that comprises an insulation film between a gate electrode and a semiconductor layer; and thickness of the insulation film placed between the gate electrode and the semiconductor layer changes in two or more steps.

Said semiconductor device may have such a feature that the thickness of the insulation film placed between the gate electrode and the semiconductor layer changes continuously.

A semiconductor device according to the present invention is characterized in that:

the semiconductor device is a field-effect transistor made of a III-V nitride semiconductor that comprises an insulation film between a gate electrode and a semiconductor layer;

the field-effect transistor has a recess structure that is formed by eliminating a part of a III-V nitride semiconductor layer or a part of the insulation film; and the gate electrode and the insulation film are placed in a part or all of the recess area.

Said semiconductor device may have such a feature that the film thickness of the insulation film placed in the recess area is thinner than the film thickness of the insulation film placed on the area other than the recess area.

The semiconductor device may have also such a feature that:

the III-V nitride semiconductor layer comprises a carrier traveling layer or a carrier supplying layer made of the III-V nitride semiconductor; and the recess structure is formed by eliminating 30% to 90% of the thickness of the carrier traveling layer or of the carrier supplying layer made of the III-V nitride semiconductor.

The semiconductor device may alternatively have such a feature that:

the recess structure is formed by eliminating 30% to 90% of the thickness of the insulation film.

The semiconductor device according to the present invention may further have such a feature that:

the gate electrode portion other than the part of the gate electrode that is most adjacent to the semiconductor layer is longer on a drain electrode side than on a source electrode side.

EFFECT OF THE INVENTION

According to the present invention, the insulation film between the gate electrode and the semiconductor layer has a thinner portion that is corresponding to the most adjacent part therebetween and a thicker portion. Only the most adjacent part thereof functions as the gate electrode, and the thicker portion has the effect of alleviating concentration of electric field on the edge of the gate electrode on the drain side. Therefore, a dielectric breakdown voltage is not reduced even if the insulation film of the most adjacent part is thinned.

Similarly, in the case of using the recess structure in the present invention, the concentration of electric field is alleviated on the edge of the recess on the drain side so that reduction in the dielectric breakdown voltage can be suppressed. Furthermore, the nitride semiconductor is significantly influenced by the current collapse due to its piezoelectric effect. As the recess structure is employed, however, only in the vicinity of the gate electrode, the insulation film is close to the carrier traveling layer while in the other area the insulation film is apart from the carrier traveling layer. Therefore, the recess structure has the effect of reducing the influence of the current collapse, and it also has the effect of improving the gain.

DESCRIPTION OF SYMBOLS

Figure 1:
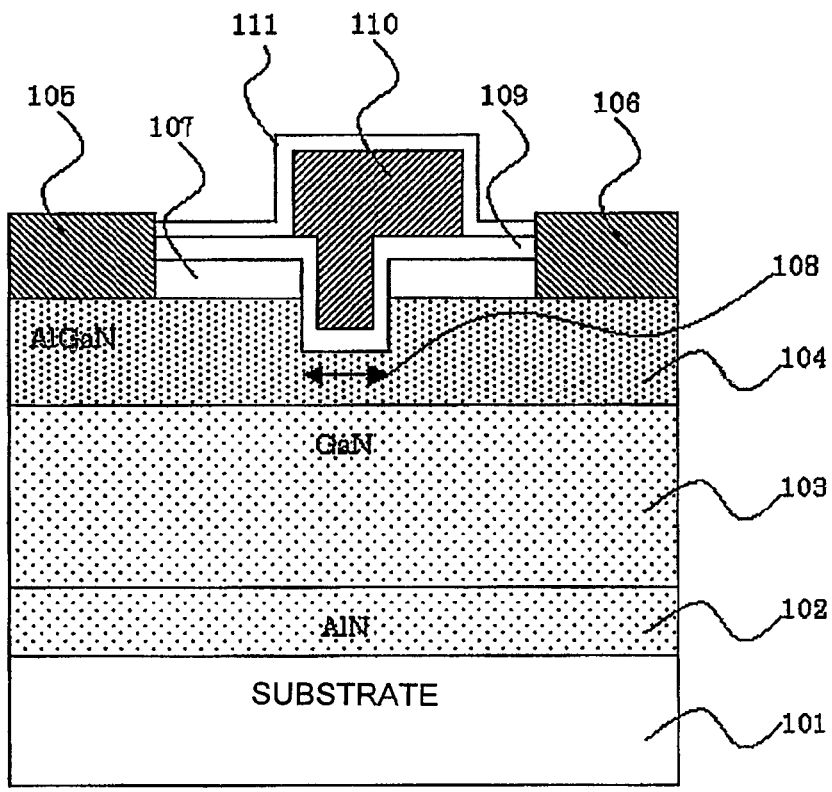
FIG. 1 is a sectional view showing a structure of a semiconductor device used for a first embodiment according to the present invention.

101, 201, 301, 401, 501 Substrate
102, 202, 302, 402, 502 Buffer layer made of first GaN-based semiconductor
103, 203, 303, 403, 503 Carrier traveling layer made of second GaN-based semiconductor
104, 304, 404, 504 Carrier supplying layer made of third GaN-based semiconductor
105, 204, 305, 407, 506 Source electrode
106, 205, 306, 408, 507 Drain electrode
107, 206, 409, 508 First insulation film
108, 207, 410 Recess area
109, 208, 307, 411, 512 Gate insulation film
110, 209, 309, 412, 513 Gate electrode
111, 210, 310, 413, 514 Protective film
211, 414, 515 Nucleation layer
308 Groove (insulation film recess area)
405 Etching stopper layer made of fourth GaN-based semiconductor
406 Ohmic contact layer made of fifth GaN-based semiconductor
505 Ohmic contact layer made of fourth GaN-based semiconductor
509 First recess area
510 Second insulation film
511 Second recess area
1001 SiC substrate
1002 AlN buffer layer
1003 GaN layer
1004 AlGaN layer
1005 Source electrode
1006 Drain electrode
1007 Insulation film
1008 Gate electrode
1009 Protective film

BEST MODE FOR CARRYING OUT THE INVENTION

Embodiments of the present invention will be explained hereinafter with reference to the drawings.

The aforementioned semiconductor device according to the present invention may also have a construction in which the thickness of an insulation film placed between the gate electrode and the semiconductor layer varies between at lest two different film thicknesses for instance. The two different film thicknesses $t_1$ and $t_2$ (where $t_1 > t_2$) can be selected in a range of $10/7 \leq (\in \cdot t_1)/(\in \cdot t_2) \leq 10/1$ as a ratio of a product ($\in \cdot t$) of a dielectric constant $\in$ of each insulation film and a film thickness $t$ thereof. There are the cases where the area in which the thickness of the insulation film placed between the gate electrode and the semiconductor layer varies comprises a continuously varying area.

Alternatively, in the case where the film thickness $t_4$ of the insulation film in a recess area is thinner than the film thickness $t_3$ of the insulation film in the area other than the recess area, the semiconductor device according to the present invention may select the film thickness $t_4$ in the range of $10/7 \leq (\in \cdot t_3)/(\in \cdot t_4) \leq 10/1$ as the ratio of the product ($\in \cdot t$) of the dielectric constant $\in$ of each insulation film and the film thickness $t$ thereof. On the other hand, in the case where the recess structure is formed by eliminating a carrier traveling layer or a carrier supplying layer made of the III-V nitride semiconductor, it is normally constructed in such a manner that a gate insulation film be in contact with a surface of the carrier traveling layer or carrier supplying layer of the recess structure.

First Embodiment

FIG. 1 illustrates an example of a first embodiment according to the present invention. FIG. 1 is a cross section structure diagram showing an embodiment of the present invention. In the field-effect transistor of this embodiment, a buffer layer 102 made of a first GaN-based semiconductor, a carrier traveling layer 103 made of a second GaN-based semiconductor and a carrier supplying layer 104 made of a third GaN-based semiconductor are formed in series on a substrate 101. Thereafter, a source electrode 105 and a drain electrode 106 are formed thereon, and a first insulation film 107 is further deposited over the whole.

After that, a recess structure 108 is made by eliminating a part of the insulation film 107 and a part of the carrier supplying layer 104 lying between the source electrode 105 and the drain electrode 106. Next, a gate insulation film 109 is deposited, and then a gate electrode 110 is formed so as to fill up the recess portion 108 and cover on over an area where the first insulation film 107 remains so that its portion on the drain electrode side is longer than that on the source electrode side. Lastly, a protective film 111 is deposited to make up the field-effect transistor.

As a material for the substrate 101 of the present invention, there are exemplified sapphire, silicon carbide, GaN, AlN and the like.

As a material for the first GaN-based semiconductor 102, there are exemplified the III nitride semiconductors of GaN, InN and AlN, and a GaN-based semiconductor alloy represented by $In_xAl_yGa_{1-x-y}N$ ($0 \leq x \leq 1$, $0 \leq y \leq 1$, $0 \leq x+y \leq 1$) for instance. It is also possible, however, to insert a nucleation layer made of the III nitride semiconductors of a GaN, InN and AlN or a GaN-based semiconductor alloy represented by $In_xAl_yGa_{1-x-y}N$ ($0 \leq x \leq 1$, $0 \leq y \leq 1$, $0 \leq x+y \leq 1$) between the substrate 101 and the first semiconductor 102, which is helpful to form the first semiconductor. It is also possible to dope Si, S, Se and the like as n-type impurities, or Be, C, Mg and the like as p-type impurities into the first GaN-based semiconductor 102.

As a material for the second GaN-based semiconductor 103, there are exemplified the III nitride semiconductors of GaN, InN and AlN, and a GaN-based semiconductor alloy represented by $In_xAl_yGa_{1-x-y}N$ ($0 \leq x \leq 1$, $0 \leq y \leq 1$, $0 \leq x+y \leq 1$) for instance. It is also possible to dope Si, S, Se and the like as n-type impurities, or Be, C, Mg and the like as p-type impurities into the second GaN-based semiconductor 103. However, when the impurity concentration in the second GaN-based semiconductor 103 becomes high, electron mobility lowers due to influence of Coulomb scattering, and thus it is desired that impurity concentration be set $1 \times 10^{17}$ cm$^{-3}$ or less.

As a material for the third GaN-based semiconductor 104, there are exemplified the III nitride semiconductors of GaN, InN and AlN, and a GaN-based semiconductor alloy represented by $In_xAl_yGa_{1-x-y}N$ ($0 \leq x \leq 1$, $0 \leq y \leq 1$, $0x+y \leq 1$) for instance. In this embodiment according to the present invention, however, chosen therefor is such a substance or a composition of which electron affinity is lower than that of the second GaN-based semiconductor 103. It is also possible to dope Si, S, Se and the like as n-type impurities, or Be, C, Mg and the like as p-type impurities into the third semiconductor 104.

In addition, it is desirable to form a hetero junction on an interface between the carrier traveling layer 103 made of the second GaN-based semiconductor and the carrier supplying layer 104 made of the third GaN-based semiconductor. When selecting an electron for a carrier traveling in the carrier traveling layer 103, it is desirable to make such a choice that conduction band energy Ec of the second GaN-based semiconductor is lower than the conduction band energy Ec of the third GaN-based semiconductor so as to have band discontinuity ΔEc existent. When selecting a hole for the carrier traveling in the carrier traveling layer 103, it is desirable to make such a choice that valence band energy Ev of the second GaN-based semiconductor is higher than the valence band energy Ev of the third GaN-based semiconductor so as to have the band discontinuity ΔEv existent.

Further, as a material for the first insulation film 107, there is exemplified a substance consisting of one or more of Si, Mg, Hf, Al, Ti and Ta and one or more of O and N. As a material for the gate insulation film 109, there is exemplified a substance consisting of one or more of Si, Mg, Hf, Al, Ti and Ta and one or more of O and N. As a material for the protective film 111, there is exemplified a substance consisting of one or more of Si, Mg, Hf, Al, Ti and Ta and one or more of O and N or an organic material.

Example 1

An example of the first embodiment according to the present invention will be presented below. The field-effect transistor of this example is constructed by using a c-plane ((0001) plane) silicon carbide (SiC) substrate as the substrate 101, an AlN layer (layer thickness: 200 nm) as the first GaN-based semiconductor 102, a GaN carrier traveling layer (layer thickness: 500 to 2000 nm) as the second GaN semiconductor 103, an AlGaN carrier supplying layer (Al composition ratio: 0.3, layer thickness: 35 nm) as the third GaN-based semiconductor 104, Ti/Al (film thickness of Ti layer: 10 nm, film thickness of Al layer: 200 nm) as the source electrode and drain electrode, a SiON film (film thickness: 80 nm) as the first insulation film, the first insulation film 107 and 25 nm thickness of the third GaN-based semiconductor 104 being eliminated as a recess, a SiON film (film thickness: 10 nm) as the gate insulation film 109, Ni/Au (film thickness of Ni layer: 10 nm, film thickness of Au layer: 200 nm) as the gate electrode 110, and a SiON film (film thickness: 80 nm) as the protective film 111, respectively.

Choice of such a structure allows only the portion of the AlGaN carrier supplying layer lying directly beneath the gate electrode to be thinned by the recess, and thereby a high gain is obtained. At the same time, the AlGaN layer being in other than the recess area is so thick that the carrier supplying layer is hardly subjected to the influence of a potential fluctuation of the SiON film/AlGaN interface, and so current collapse can also be suppressed. The portion of the gate electrode extended to the drain electrode side alleviates concentration of electric field on an edge of the gate electrode on the drain electrode side. Therefore, even if the gate insulation film is as thin as 10 nm, it can realize dielectric breakdown voltage of 200 V or higher.

In this example, SiC is employed as the substrate. However, any other substrate such as sapphire may be used. Furthermore, in this example, the c-plane ((0001) plane) of the SiC substrate is used. However, any plane on which the GaN-based semiconductor is grown in c-axis-oriented manner so as to generate a piezoelectric effect in the same direction as this embodiment may be also employed. The plane to be used may be inclined up to approximately 55° in any direction. It is desirable, however, to incline it within 10° in an arbitrary direction because a larger inclination makes it difficult to obtain a good crystalline property.

Similarly, in this example, the GaN layer is employed as the carrier traveling layer. However, it is possible, as for the carrier traveling layer, to use the III nitride semiconductors of GaN, InN or AlN as well as a GaN-based semiconductor alloy represented by $In_xAl_yGa_{1-x-y}N$ ($0 \leq x \leq 1$, $0 \leq y \leq 1$, $0 \leq x+y \leq 1$), such as an InGaN layer. Furthermore, as for the film thickness of each of the layers, a desired film thickness may be set. However, a lattice constant of each of the second and third layers is different from the lattice constant of the first layer, and so it is preferable that the film thickness thereof be set no thicker than its critical film thickness at which a misfit dislocation could be generated.

In this example, any impurities are not doped into the GaN carrier traveling layer. However, it may be doped with Si, S, Se and the like as the n-type impurities or with Be, C and the like as the p-type impurities. However, when the impurity concentration in the carrier traveling layer becomes high, the electron mobility lowers due to influence of the Coulomb scattering, and therefore, it is desirable that the impurity concentration be set $1 \times 10^{17}$ cm$^{-3}$ or less.

In this example, Ti/Al is used as the source electrode 105 and drain electrode 106. However, any metal which is capable of being in ohmic contact with AlGaN that is used as the carrier supplying layer 104 in this example may be employed for the source electrode and drain electrode. For instance, the metals such as W, Mo, Si, Ti, Pt, Nb, Al and Au may be used, and also a layered structure made with a plurality of metals may be used.

Similarly, in this example, Ni/Au is used as the gate metal 110. However, a desired metal may be used since the gate electrode is not in direct contact with the semiconductor layer according to the present invention. It is desirable that such a metal that does not react to the gate insulation film is used.

In this example, 25 nm thickness of the third GaN-based semiconductor is eliminated when making the recess structure. However, the thickness of the semiconductor to be eliminated for forming the recess may be chosen in an arbitrary thickness, and thus it is possible to eliminate up to the thickness of the third GaN-based semiconductor. If the semiconductor thickness to be eliminated is thin, it reduces the effects of the recess structure of improving the breakdown voltage and decreasing the current collapse. If the semiconductor thickness to be eliminated is thick, the increase in the resistance is caused by the reduction of the carriers lying under the gate. Therefore, it is preferable that the semiconductor thickness to be eliminated be 30% to 90% of the originally formed semiconductor thickness.

In this example, it is explained that the gate electrode 110 is formed so as to fill up the recess portion 108. However, there may be occurred a minute clearance between the gate electrode and a recess sidewall portion in the process of making it.

Further, as this example is the mode in which the electron is selected for the traveling carrier, it is formed in such a manner that an overhanging portion of the gate electrode is longer on the drain electrode side than that on the source electrode side. However, the overhanging portion on the source electrode side is not involved in the effects of the present invention so that it may also be equal to or longer than the overhanging portion on the drain electrode side. If the overhanging portion on the source electrode side becomes longer, such a demerit as reduction in the gain due to increase in gate capacity is significant, in contrast with the effects of improving the breakdown voltage and decreasing the current collapse. Therefore, it is desirable that the overhanging portion on the source electrode side be shorter than the overhanging portion on the drain electrode side.

In this example, the recess structure is formed by eliminating a part of the first insulation film and the carrier supplying layer. A high gain is obtained by thinning the portion of the carrier supplying layer that is lying in the recess area. A high breakdown voltage can be realized by extending the gate electrode to the drain electrode side and thereby alleviating concentration of electric field on the drain electrode side.

On the other hand, in such a mode where a hole is selected as the traveling carrier, a region where the electric field concentrates is reverse to that in the mode where an electron is selected as the traveling carrier. Therefore, the side on which the overhanging portion of the gate electrode is provided is also reversed.

Second Embodiment

Figure 2:
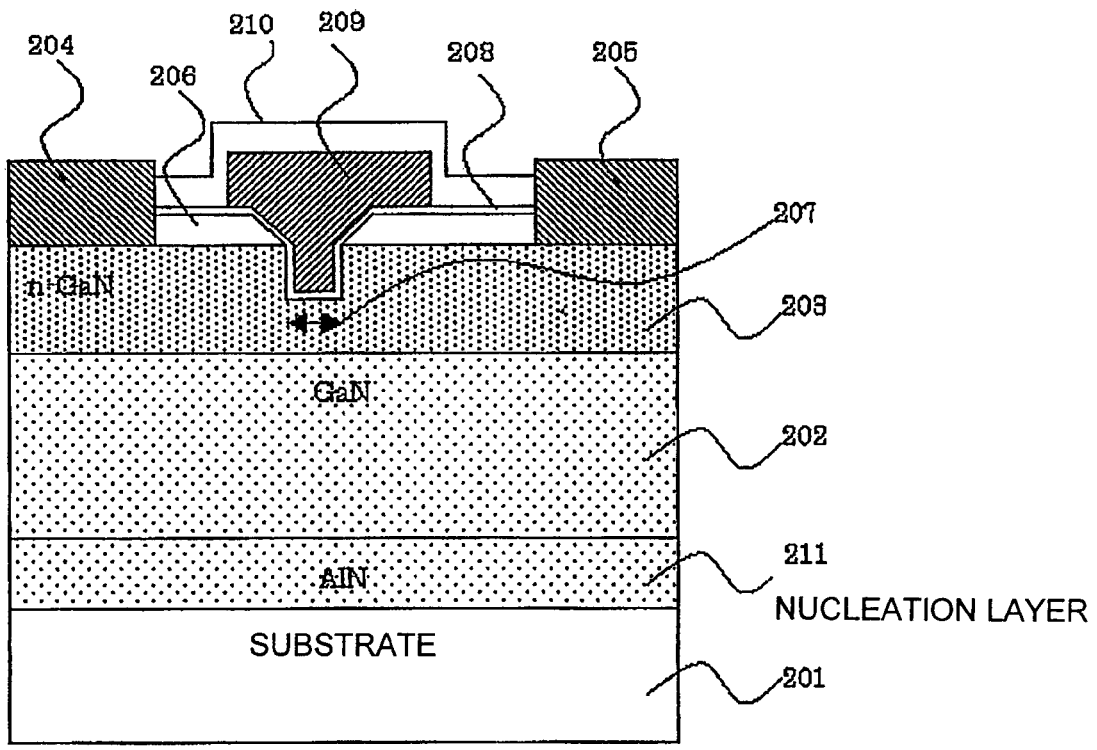
FIG. 2 is a sectional view showing the structure of the semiconductor device used for a second embodiment according to the present invention.

FIG. 2 illustrates an example of a second embodiment according to the present invention. FIG. 2 is a cross section structure diagram showing an embodiment of the present invention. In the field-effect transistor of this embodiment, a buffer layer 202 made of the first GaN-based semiconductor and a carrier traveling layer 203 made of the second GaN carrier semiconductor are sequentially formed on a substrate 201. Thereafter, a source electrode 204 and a drain electrode 205 are formed thereon, and a first insulation film 206 is further deposited. After that, a part of the insulation film 206 lying between the source electrode 204 and the drain electrode 205 is eliminated by isotropic etching or the like to be tapered, and a part of the carrier traveling layer 203 is further eliminated so as to make up a recess structure 207.

Next, a gate insulation film 208 is deposited, and then a gate electrode 209 is formed so as to fill up the recess portion 207 and cover on over an area where the first insulation film remains so that its portion on the drain electrode side is longer than that on the source electrode side. Lastly, a protective film 210 is deposited to make up the field-effect transistor.

As a material for the substrate 201 of this embodiment, there are exemplified sapphire, silicon carbide, GaN and AlN for instance. As for the first GaN-based semiconductor 202, there are the III nitride semiconductors of GaN, InN and AlN, and the GaN-based semiconductor alloy represented by $In_xAl_yGa_{1-x-y}N$ ($0 \leq x \leq 1, 0 \leq y \leq 1, 0x+y \leq 1$) for instance. It is also possible, however, to insert a nucleation layer 211 made of the III nitride semiconductors of a GaN, InN and AlN or a GaN-based semiconductor alloy represented by $In_xAl_yGa_{1-x-y}N$ ($0 \leq x \leq 1, 0 \leq y \leq 1, 0x+y \leq 1$) between the substrate 201 and the first semiconductor 202, which is helpful to form the first semiconductor. It is also possible to dope Si, S, Se and the like as n-type impurities, or Be, C, Mg and the like as p-type impurities into the first GaN-based semiconductor 202.

As a material for the second GaN-based semiconductor 203, there are exemplified the III nitride semiconductors of GaN, InN and AlN, and the GaN-based semiconductor alloy represented by $In_xAl_yGa_{1-x-y}N$ ($0 \leq x \leq 1, 0 \leq y \leq 1, 0x+y \leq 1$) for instance. It is also possible to dope Si, S, Se and the like as n-type impurities and Be, C, Mg and the like as p-type impurities into the second GaN-based semiconductor 203.

Further, It is desirable to form a hetero junction on an interface between the buffer layer 202 made of the first GaN-based semiconductor and the carrier traveling layer 203 made of the second GaN-based semiconductor. When selecting an electron for a carrier traveling in the carrier traveling layer 203, it is desirable to make such a choice that conduction band energy Ec of the second GaN-based semiconductor is lower than the conduction band energy Ec of the first GaN-based semiconductor so as to have band discontinuity ΔEc existent. When selecting a hole for the carrier traveling in the carrier traveling layer 203, it is desirable to make such a choice that valence band energy Ev of the second GaN-based semiconductor is higher than the valence band energy Ev of the first GaN-based semiconductor so as to have the band discontinuity ΔEv existent.

In addition, as a material for the first insulation film 206, there is exemplified a substance consisting of one or more of Si, Mg, Hf, Al, Ti and Ta and one or more of O and N. As a material for the gate insulation film 208, there is exemplified a substance consisting of one or more of Si, Mg, Hf, Al, Ti and Ta and one or more of O and N. As a material for the protective film 210, there is exemplified a substance consisting of one or more of Si, Mg, Hf, Al, Ti and Ta and one or more of O and N or an organic material.

Example 2

An example of the second embodiment according to the present invention will be presented below. The field-effect transistor of this example is constructed by using a c-plane ((0001) plane) silicon carbide (SiC) substrate as the substrate 201, an AlN layer (layer thickness: 100 nm) as the nucleation layer 211, a GaN layer (layer thickness: 2000 nm) as the first GaN-based semiconductor 202, a Si-doped GaN carrier traveling layer (layer thickness: 100 nm, doping level of Si: $1 \times 10^{18}$ cm$^{-3}$) as the second GaN-based semiconductor 203, Ti/Al (film thickness of the Ti layer: 10 nm, film thickness of the Al layer: 200 nm) as the source electrode and drain electrode, a SiON film (film thickness: 80 nm) as the first insulation film 206, the first insulation film eliminated by dry etching using an $SF_6$ gas as isotropic etching and 50 nm of the second GaN-based semiconductor 203 being eliminated by dry etching using a $BCl_3$ gas as the recess, a SiON film (film thickness: 20 nm) as the gate insulation film 208, Ni/Au (film thickness of Ni layer: 10 nm, film thickness of Au layer: 200 nm) as the gate electrode 209, and a SiON film (film thickness: 80 nm) as the protective film 210, respectively.

Choice of such a structure allows only the GaN carrier traveling layer lying directly beneath the gate electrode to be thinned by the recess, and thereby a high gain is obtained. At the same time, the GaN I carrier traveling layer being in other than the recess area is so thick that the carrier supplying layer is hardly subjected to the influence of a potential fluctuation of the SiON film/GaN interface, and so current collapse can also be suppressed. The portion of the gate electrode extended to the drain electrode side alleviates concentration of electric field on an edge of the gate electrode on the drain electrode side. Therefore, even if the gate insulation film is as thin as 20 nm, it can realize dielectric breakdown voltage of 200 V or higher.

In this example SiC is employed as the substrate. However, any other substrate such as sapphire may be used. Furthermore, in this example, the c-plane ((0001) plane) of the SiC substrate is used. However, any plane on which the GaN-based semiconductor is grown in c-axis-oriented manner so as to generate a piezoelectric effect in the same direction as this embodiment may be also employed. The plane to be used may be inclined up to approximately 55☐ in any direction. It is desirable, however, to incline it within 10☐ in an arbitrary direction because a larger inclination makes it difficult to obtain a good crystalline property.

Similarly, in this example, the GaN layer is used as the carrier traveling layer. However, it is possible, as for the carrier traveling layer, to use the III nitride semiconductors of GaN, InN or AlN as well as a GaN-based semiconductor alloy represented by $In_xAl_yGa_{1-x-y}N$ ($0 \leq x \leq 1$, $0 \leq y \leq 1$, $0 \leq x+y \leq 1$), such as an InGaN layer. Furthermore, as for the film thickness of each of the layers, a desired film thickness may be set.

In addition, In this example, Si at $1 \times 10^{18}$ cm$^{-3}$ is doped in the GaN carrier traveling layer. However, it is also possible to dope Si, S, Se and the like as the n-type impurities, or Be, C and the like as the p-type impurities. However, there is a tendency that the electron mobility lowers due to influence of the Coulomb scattering and the breakdown voltage is also reduced when the impurity concentration in the carrier traveling layer becomes high, and in contrast, traveling carriers are reduced and current density lowers when the impurity concentration in the carrier traveling layer becomes low. Therefore, it is desired that the impurity concentration is set between $1 \times 10^{17}$ cm$^{-3}$ and $3 \times 10^{18}$ cm$^{-3}$.

Further, in this example, Ti/Al is used as the source electrode 204 and drain electrode 205. However, any metal which is capable of being in ohmic contact with AlGaN that is used as the carrier supplying layer 104 in this example may be employed for the source electrode and drain electrode. For instance, the metals such as W, Mo, Si, Ti, Pt, Nb, Al and Au may be used, and also a layered structure made with a plurality of metals may be used.

Similarly, in this example, Ni/Au is used as the gate metal 209. However, a desired metal may be used since the gate electrode is not in direct contact with the semiconductor layer according to the present invention. It is desirable that such a metal that does not react to the gate insulation film is used.

In this example, 50 nm thickness of the second GaN-based semiconductor is eliminated when making the recess structure. However, the thickness of the semiconductor to be eliminated for forming the recess may be chosen in an arbitrary thickness, and thus it is possible to eliminate up to the thickness of the second GaN-based semiconductor. If the semiconductor thickness to be eliminated is thin, it reduces the effects of the recess structure of improving the breakdown voltage and decreasing the current collapse. If the semiconductor thickness to be eliminated is thick, the increase in the resistance is caused by the reduction of the carriers lying under the gate. Therefore, it is preferable that the semiconductor thickness to be eliminated be 30% to 90% of the originally formed semiconductor thickness.

In this example, it is explained that the gate electrode 209 is formed so as to fill up the recess portion 207. However, there may be occurred a minute clearance between the gate electrode and a recess sidewall portion in the process of making it.

Further, as this example is the mode in which the electron is selected for the traveling carrier, it is formed in such a manner that an overhanging portion of the gate electrode is longer on the drain electrode side than that on the source electrode side. However, the overhanging portion on the source electrode side is not involved in the effects of the present invention so that it may also be equal to or longer than the overhanging portion on the drain electrode side. If the overhanging portion on the source electrode side becomes longer, such a demerit as reduction in the gain due to increase in gate capacity is significant, in contrast with the effects of improving the breakdown voltage and decreasing the current collapse. Therefore, it is desirable that the overhanging portion on the source electrode side be shorter than the overhanging portion on the drain electrode side.

In this example, the recess structure is formed by eliminating a part of the first insulation film and the carrier traveling layer. A high gain can be obtained by thinning the portion of the carrier traveling layer lying in the recess area. A high breakdown voltage can be realized by extending the gate electrode to the drain electrode side and thereby alleviating the concentration of the electric field on the drain electrode side.

On the other hand, in such a mode where a hole is selected as the traveling carrier, a region where the electric field concentrates is reverse to that in the mode where an electron is selected as the traveling carrier. Therefore, the side on which the overhanging portion of the gate electrode is provided is also reversed.

Third Embodiment

Figure 3:
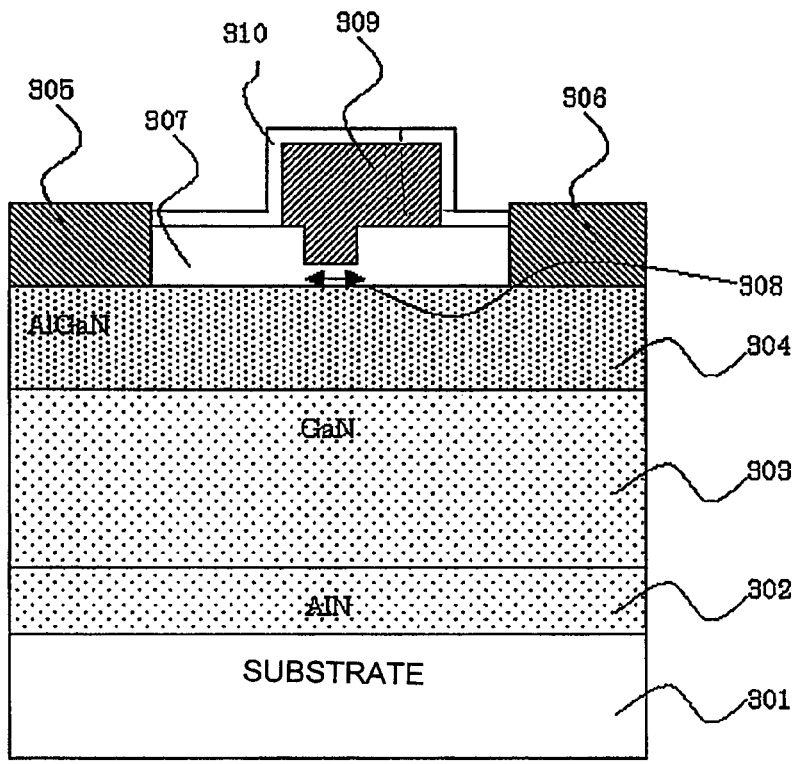
FIG. 3 is a sectional view showing the structure of the semiconductor device used for a third embodiment according to the present invention.

FIG. 3 illustrates an example of a third embodiment according to the present invention. FIG. 3 is a cross section structure diagram showing an embodiment of the present invention. In the field-effect transistor of this embodiment, a buffer layer 302 made of the first GaN-based semiconductor and a carrier traveling layer 303 made of the second GaN-based semiconductor, and a carrier supplying layer 304 made of the third GaN-based semiconductor are formed in series on a substrate 301.

Thereafter, a source electrode 305 and a drain electrode 306 are formed thereon, and then a gate insulation film 307 is further deposited. Thereafter, a part of the gate insulation film 307 between the source electrode 305 and the drain electrode 306 is eliminated to make a groove 308 for embedding a gate electrode. Next, the gate electrode 309 is formed fill up the groove 308 and cover on over an area where a part of the gate insulation film 307 is not eliminated so that its portion on the drain electrode side is longer than that on the source electrode side. Lastly, a protective film 310 is formed to make up the field-effect transistor.

As a material for the substrate 301 of this embodiment, there are exemplified sapphire, silicon carbide, GaN, AlN and the like.

Further, as a material for the first GaN-based semiconductor 302, there are exemplified the III nitride semiconductors of GaN, InN or AlN as well as the GaN-based semiconductor alloy represented by $In_xAl_yGa_{1-x-y}N$ ($0 \leq x \leq 1$, $0 \leq y \leq 1$, $0 x+y \leq 1$) for instance. It is also possible, however, to insert a nucleation layer made of the III nitride semiconductors of GaN, InN and AlN or a GaN-based semiconductor alloy represented by $In_xAl_yGa_{1-x-y}N$ ($0 \leq x \leq 1$, $0 \leq y \leq 1$, $0 x+y \leq 1$) between the substrate 301 and the first semiconductor 302, which is helpful to form the first semiconductor. It is also possible to dope Si, S, Se and the like as n-type impurities, or Be, C, Mg and the like as p-type impurities into the first GaN-based semiconductor 302.

Further, as a material for the second GaN-based semiconductor 303, there are exemplified the III nitride semiconductors of GaN, InN or AlN and the GaN-based semiconductor alloy represented by $In_xAl_yGa_{1-x-y}N$ ($0 \leq x \leq 1$, $0 \leq y \leq 1$, $0 x+y \leq 1$) for instance. It is also possible to dope Si, S, Se and the like as n-type impurities, or Be, C, Mg and the like as p-type impurities into the second GaN-based semiconductor 303. However, when the impurity concentration in the second GaN-based semiconductor 303 becomes high, electron mobility lowers due to influence of Coulomb scattering, and thus it is desired that impurity concentration be set $1 \times 10^{17}$ $cm^{-3}$ or less.

In addition, as a material for the third GaN-based semiconductor 304, there are exemplified the III nitride semiconductors of GaN, InN or AlN as well as the GaN-based semiconductor alloy represented by $In_xAl_yGa_{1-x-y}N$ ($0 \leq x \leq 1$, $0 \leq y \leq 1$, $0 x+y \leq 1$) for instance. In this embodiment according to the present invention, however, chosen therefor is such a substance or a composition of which electron affinity is lower than that of the second GaN-based semiconductor 303. It is also possible to dope Si, S, Se and the like as n-type impurities, or Be, C, Mg and the like as p-type impurities into the third semiconductor 304.

Accordingly, it is desirable to form a hetero junction on an interface between the carrier traveling layer 303 made of the second GaN-based semiconductor and the carrier supplying layer 304 made of the third GaN-based semiconductor. When selecting an electron for a carrier traveling in the carrier traveling layer 303, it is desirable to make such a choice that conduction band energy Ec of the second GaN-based semiconductor is lower than the conduction band energy Ec of the third GaN-based semiconductor so as to have band discontinuity ΔEc existent. When selecting a hole for the carrier traveling in the carrier traveling layer 303, it is desirable to make such a choice that valence band energy Ev of the second GaN-based semiconductor is higher than the valence band energy Ev of the third GaN-based semiconductor so as to have the band discontinuity ΔEv existent.

Further, as a material for the gate insulation film 307, there is exemplified a substance consisting of one or more of Si, Mg, Hf, Al, Ti and Ta and one or more of O and N. As a material for the protective film 310, there is exemplified a substance consisting of one or more of Si, Mg, Hf, Al, Ti and Ta and one or more of O and N or an organic material.

Example 3

An example of the third embodiment according to the present invention will be presented below. The field-effect transistor of this example is constructed by using a c-plane ((0001) plane) silicon carbide (SiC) substrate as the substrate 301, an AlN layer (layer thickness: 200 nm) as the first GaN-based semiconductor 302, a GaN carrier traveling layer (layer thickness: 500 to 2000 nm) as the second GaN-based semiconductor 303, an AlGaN carrier supplying layer (Al composition ratio: 0.3, layer thickness: 35 nm) as the third GaN-based semiconductor 304, Ti/Al (film thickness of the Ti layer: 10 nm, film thickness of the Al layer: 200 nm) as the source electrode 305 and drain electrode 306, a SiON film (film thickness: 80 nm) as the gate insulation film 307, 70 nm thickness of the gate insulation film 307 being eliminated as the groove for placing the gate electrode, Ni/Au (film thickness of the Ni layer: 10 nm, film thickness of the Au layer: 200 nm) as the gate electrode 309, and a SiON film (film thickness: 80 nm) as the protective film 310, respectively.

Choice of such a structure allows only the portion of the insulation film lying directly under the gate electrode to be thinned by the recess, and thereby a high gain is obtained. At the same time, the gate insulation film other than the groove is so thick that the current collapse can be reduced. The portion of the gate electrode extended to the drain electrode side alleviates concentration of electric field on an edge of the gate electrode on the drain electrode side. Therefore, even if the gate insulation film is as thin as 10 nm, it can realize dielectric breakdown voltage of 200 V or higher.

In this example, SiC is employed as the substrate. However, any other substrate such as sapphire may be used. Furthermore, in this example, the c-plane ((0001) plane) of the SiC substrate is used. However, any plane on which the GaN-based semiconductor is grown in c-axis-oriented manner so as to generate a piezoelectric effect in the same direction as this embodiment may be also employed. The plane to be used may be inclined up to approximately 55° in any direction. It is desirable, however, to incline it within 10° in an arbitrary direction because a larger inclination makes it difficult to obtain a good crystalline property.

Similarly, in this example, the GaN layer is employed as the carrier traveling layer. However, it is possible, as for the carrier traveling layer, to use the III nitride semiconductors of GaN, InN or AlN as well as a GaN-based semiconductor alloy represented by $In_xAl_yGa_{1-x-y}N$ ($0 \leq x \leq 1$, $0 \leq y \leq 1$, $0 \leq x+y \leq 1$), such as an InGaN layer. Furthermore, as for the film thickness of each of the layers, a desired film thickness may be set. However, a lattice constant of each of the second and third layers is different from the lattice constant of the first layer, and so it is preferable that the film thickness thereof be set no thicker than its critical film thickness at which a misfit dislocation could be generated.

In this example, any impurities are not doped into the GaN carrier traveling layer. However, it may be doped with Si, S, Se and the like as the n-type impurities or with Be, C and the like as the p-type impurities. However, when the impurity concentration in the carrier traveling layer becomes high, the electron mobility lowers due to influence of the Coulomb scattering, and therefore, it is desirable that the impurity concentration be set $1 \times 10^{17}$ $cm^{-3}$ or less.

In this example, Ti/Al is used as the source electrode 305 and drain electrode 306. However, any metal which is capable of being in ohmic contact with AlGaN that is used as the carrier supplying layer 304 in this example may be employed for the source electrode and drain electrode. For instance, the metals such as W, Mo, Si, Ti, Pt, Nb, Al and Au may be used, and also a layered structure made with a plurality of metals may be used.

Similarly, in this example, Ni/Au is used as the gate metal 309. However, a desired metal may be used since the gate electrode is not in direct contact with the semiconductor layer according to the present invention. It is desirable that such a metal that does not react to the gate insulation film is used.

In this example, 70 nm thickness of the gate insulation film is eliminated when making the groove for placing the gate electrode. However, the thickness of the gate insulation film to be eliminated for forming the groove for placing the gate electrode may be chosen in an arbitrary thickness. If the gate insulation film thickness to be eliminated is thin, the portion of the insulation film lying directly under the gate electrode becomes thick or the insulation film thickness being on areas other than the groove becomes thin so that it becomes difficult to simultaneously realize the high gain and reduction in the current collapse. Therefore, it is desirable that the gate insulation film thickness to be eliminated be 30% to 90% of the originally formed gate insulation film thickness.

As it is the mode in which the electron is selected for the traveling carrier, in this example, it is explained that the groove portion 308 is filled up with the gate electrode 309. However, there may be occurred a minute clearance between the gate electrode and a recess sidewall portion in the process of making it.

Further, in this example, it is formed in such a manner that an overhanging portion of the gate electrode is longer on the drain electrode side than that on the source electrode side. However, the overhanging portion on the source electrode side is not involved in the effects of the present invention so that it may also be equal to or longer than the overhanging portion on the drain electrode side. If the overhanging portion on the source electrode side becomes longer, such a demerit as reduction in the gain due to increase in gate capacity is significant, in contrast with the effects of improving the breakdown voltage and decreasing the current collapse. Therefore, it is preferable that the overhanging portion on the source electrode side be shorter than the overhanging portion on the drain electrode side.

In this example, the recess structure is formed by eliminating a part of the gate insulation film. A high gain can be obtained by thinning a portion of the gate oxide film lying in the recess area and shortening the distance between the gate electrode and the carrier traveling layer. In addition, a high breakdown voltage can be realized by extending the gate electrode to the drain electrode side and thereby alleviating concentration of the electric field on the drain electrode side.

On the other hand, in such a mode where a hole is selected as the traveling carrier, a region where the electric field concentrates is reverse to that in the mode where an electron is selected as the traveling carrier. Therefore, the side on which the overhanging portion of the gate electrode is provided is also reversed.

Fourth Embodiment

Figure 4:
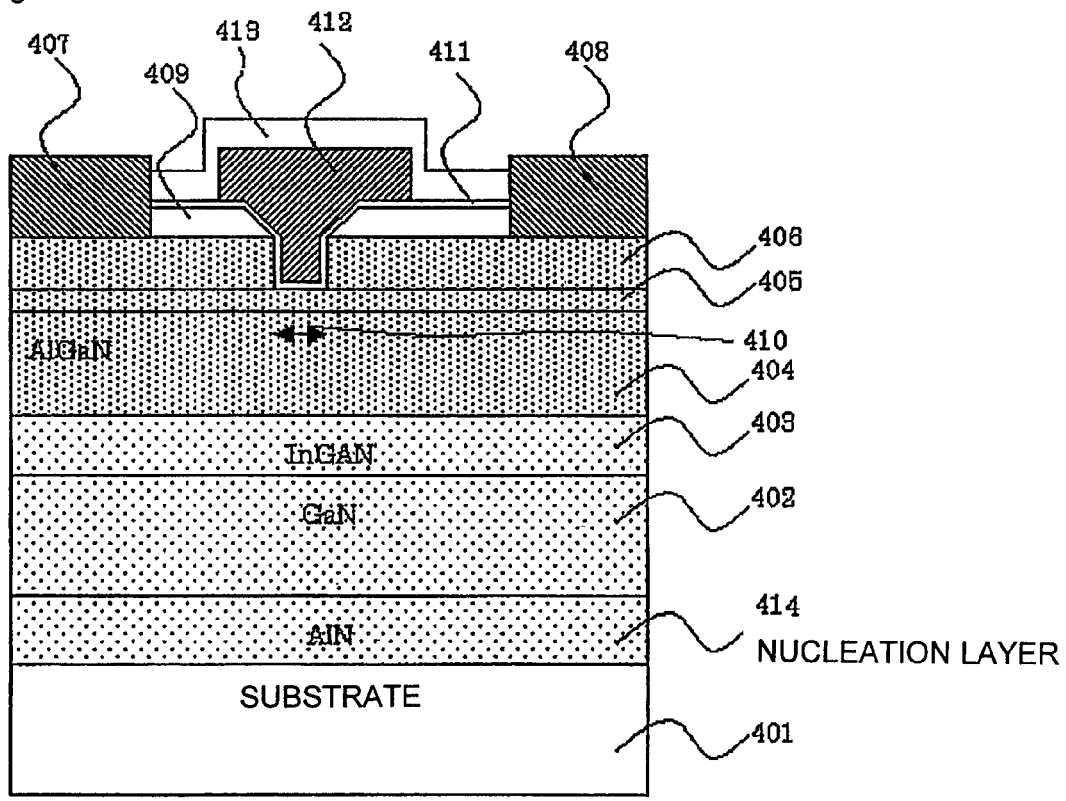
FIG. 4 is a sectional view showing the structure of the semiconductor device used for a fourth embodiment according to the present invention.

FIG. 4 illustrates an example of a fourth embodiment according to the present invention. FIG. 4 is a cross section structure diagram showing an embodiment of the present invention. In the field-effect transistor of this embodiment, a buffer layer 402 made of the first GaN-based semiconductor, a carrier traveling layer 403 made of the second GaN-based semiconductor, a carrier supplying layer 404 made of the third GaN-based semiconductor, an etching stopper layer 405 made of the fourth GaN-based semiconductor and an ohmic contact layer 406 made of the fifth GaN-based semiconductor are formed in series on a substrate 401.

Thereafter, a source electrode 407 and a drain electrode 408 are formed thereon, and then a first insulation film 409 is further deposited. After that, a part of the insulation film 409 lying between the source electrode 407 and the drain electrode 408 is eliminated by isotropic etching or the like to be tapered, and a part of the ohmic contact layer 406 in the area where the opening is formed in the first insulation film 409 is further eliminated so as to make up a recess structure 410. Next, a gate insulation film 411 is deposited, and then a gate electrode 412 is formed so as to fill up the recess portion 410 and cover on over an area where the first insulation film remains so that its portion on the drain electrode side is longer than that on the source electrode side. Lastly, a protective film 413 is deposited to make up the field-effect transistor.

As a material for the substrate 401 of this embodiment, there are exemplified sapphire, silicon carbide, GaN and AlN for instance.

Further, as a material for the first GaN-based semiconductor 402, there are exemplified the III nitride semiconductors of GaN, InN and AlN, and the GaN-based semiconductor alloy represented by $In_xAl_yGa_{1-x-y}N$ ($0 \leq x \leq 1$, $0 \leq y \leq 1$, $0 x+y \leq 1$) for instance. It is also possible, however, to insert a nucleation layer 414 made of the III nitride semiconductors of a GaN, InN and AlN or an alloy composed of the aforementioned three types of the GaN-based semiconductors between the substrate 401 and the first semiconductor 402, which is helpful to form the first semiconductor. It is also possible to dope Si, S, Se and the like as n-type impurities, or Be, C, Mg and the like as p-type impurities into the first GaN-based semiconductor 402.

Furthermore, as a material for the second GaN-based semiconductor 403, there are exemplified the III nitride semiconductors of GaN, InN and AlN and the GaN-based semiconductor alloy represented by $In_xAl_yGa_{1-x-y}N$ ($0 \leq x \leq 1$, $0 \leq y \leq 1$, $0 x+y \leq 1$) for instance. It is also possible to dope Si, S, Se and the like as n-type impurities, or Be, C, Mg and the like as p-type impurities into the second GaN-based semiconductor 403. However, when the impurity concentration in the second GaN-based semiconductor becomes high, electron mobility lowers due to influence of Coulomb scattering, and thus it is desired that impurity concentration be set $1 \times 10^{17}$ $cm^{-3}$ or less.

In addition, as a material for the third GaN-based semiconductor 404, there are exemplified the III nitride semiconductors of GaN, InN and AlN and the GaN-based semiconductor alloy represented by $In_xAl_yGa_{1-x-y}N$ ($0 \leq x \leq 1$, $0 \leq y \leq 1$, $0 x+y \leq 1$) for instance. In this embodiment according to the present invention, however, chosen therefor is such a substance or a composition of which electron affinity is lower than that of the second GaN-based semiconductor 403. It is also possible to dope Si, S, Se and the like as n-type impurities, or Be, C, Mg and the like as p-type impurities into the third semiconductor 404.

Accordingly, it is desirable to form a hetero junction on an interface between the carrier traveling layer 403 made of the second GaN-based semiconductor and the carrier supplying layer 304 made of the third GaN-based semiconductor. When selecting an electron for a carrier traveling in the carrier traveling layer 403, it is desirable to make such a choice that conduction band energy Ec of the second GaN-based semiconductor is lower than the conduction band energy Ec of the third GaN-based semiconductor so as to have band discontinuity ΔEc existent. When selecting a hole for the carrier traveling in the carrier traveling layer 403, it is desirable to make such a choice that valence band energy Ev of the second GaN-based semiconductor is higher than the valence band energy Ev of the third GaN-based semiconductor so as to have the band discontinuity ΔEv existent.

Further, as a material for the fourth GaN-based semiconductor 405, there are exemplified the III nitride semiconductors of GaN, InN and AlN, and the GaN-based semiconductor alloy represented by $In_xAl_yGa_{1-x-y}N$ ($0 \leq x \leq 1$, $0 \leq y \leq 1$, $0 x+y \leq 1$) for instance. In this embodiment according to the present invention, however, chosen therefor should be such a substance or a composition which is different from the third and fifth GaN-based semiconductors. It is also possible to dope Si, S, Se and the like as n-type impurities, or Be, C, Mg and the like as p-type impurities into the forth semiconductor 405.

In addition, as a material for the fifth GaN-based semiconductor 406, there are exemplified the III nitride semiconductors of GaN, InN and AlN, and the GaN-based semiconductor alloy represented by $In_xAl_yGa_{1-x-y}N$ ($0 \leq x \leq 1$, $0 \leq y \leq 1$, $0 x+y \leq 1$) for instance. In this embodiment according to the present invention, however, chosen therefor should be such a substance or a composition which is different from the forth GaN-based semiconductor. It is also possible to dope Si, S, Se and the like as n-type impurities, or Be, C, Mg and the like as p-type impurities into the fifth semiconductor 406.

On the other hand, as a material for the first insulation film 409, there is exemplified a substance consisting of one or more of Si, Mg, Hf, Al, Ti and Ta and one or more of O and N. As a material for the gate insulation film 411, there is exemplified a substance consisting of one or more of Si, Mg, Hf, Al, Ti and Ta and one or more of O and N.

Further, as a material for the protective film 413, there is exemplified a substance consisting of one or more of Si, Mg, Hf, Al, Ti and Ta and one or more of O and N or an organic material.

Example 4

An example of the fourth embodiment according to the present invention will be presented below. The field-effect transistor of this example is constructed by using a c-plane ((0001) plane) silicon carbide (SiC) substrate as the substrate 401, an AlN layer (layer thickness: 200 nm) as the nucleation layer 414, a GaN layer (layer thickness: 2000 nm) as the first GaN-based semiconductor 402, an InGaN carrier traveling layer (composition ratio of In: 0.15, layer thickness: 15 nm) as the second GaN-based semiconductor 403, an AlGaN carrier supplying layer (composition ratio of Al: 0.2, layer thickness: 15 nm) as the third GaN-based semiconductor 404, an AlGaN etching stopper layer (composition ratio of Al: 0.6, layer thickness: 5 nm) as the fourth GaN-based semiconductor 405, a Si-doped AlGaN ohmic contact layer (composition ratio of Al: 0.3, layer thickness: 10 nm, doping level of Si: $1 \times 10^{19}$ cm$^{-3}$) as the fifth GaN-based semiconductor 406, Ti/Al (film thickness of the Ti layer: 10 nm, film thickness of the Al layer: 200 nm) as the source electrode 407 and drain electrode 408, a SiON film (film thickness: 80 nm) as the first insulation film 409, a portion of the first insulation film eliminated by dry etching using an $SF_6$ gas as isotropic etching and a part of the fifth GaN-based semiconductor 406 eliminated by dry etching using a mixed gas of $BCl_3$ and $SF_6$ as the recess, a SiON film (film thickness: 10 nm) as the gate insulation film 411, Ni/Au (film thickness of Ni layer: 10 nm, film thickness of Au layer: 200 nm) as the gate electrode 412, and a SiON film (film thickness: 60 nm) as the protective film 413, respectively.

Choice of such a structure allows only the distance between the electrodes and the carrier traveling layer lying directly beneath the gate electrode to be shortened by the recess, and thereby a high gain is obtained. At the same time, the distance between the surface of the semiconductors and the carrier traveling layer in the areas other than the recess area is so long that the carrier supplying layer is hardly subjected to the influence of a potential fluctuation of the SiON film/AlGaN interface, and so current collapse can also be suppressed.

Further, the portion of the gate electrode extended to the drain electrode side alleviates concentration of electric field on an edge of the gate electrode on the drain electrode side. Therefore, even if the gate insulation film is as thin as 10 nm, it can realize dielectric breakdown voltage of 200 V or higher. Furthermore, in this example, recess depth is controlled by employing the etching stopper layer, which can improve in-plane uniformity and reproducibility.

In this example, SiC is employed as the substrate. However, any other substrate such as sapphire may be used. Furthermore, in this example, the c-plane ((0001) plane) of the SiC substrate is used. However, any plane on which the GaN-based semiconductor is grown in c-axis-oriented manner so as to generate a piezoelectric effect in the same direction as this embodiment may be also employed. The plane to be used may be inclined up to approximately 55° in any direction. It is preferable, however, to incline it within 10° in an arbitrary direction because a larger inclination makes it difficult to obtain a good crystalline property.

Similarly, in this example, the InGaN layer which has In composition ratio of 0.15 is employed as the carrier traveling layer. However, it is possible, as for the carrier traveling layer, to use the III nitride semiconductors of GaN, InN or AlN as well as a GaN-based semiconductor alloy represented by $In_xAl_yGa_{1-x-y}N$ ($0 \leq x \leq 1$, $0 \leq y \leq 1$, $0 \leq x+y \leq 1$). In order to accumulate carriers therein, It is preferable that a band gap width of the semiconductor to be used for the carrier traveling layer be at least narrower than the band gap width of the carrier supplying layer.

Similarly, as for the film thickness of each of the layers, a desired film thickness may be set. However, a lattice constant of each of the second, third, forth and fifth layers is different from the lattice constant of the first layer, and so it is preferable that the film thickness thereof be set no thicker than its critical film thickness at which a misfit dislocation could be generated.

In this example, any impurities are not doped into the InGaN carrier traveling layer. However, it may be doped with Si, S, Se and the like as the n-type impurities or with Be, C and the like as the p-type impurities. However, when the impurity concentration in the carrier traveling layer becomes high, the electron mobility lowers due to influence of the Coulomb scattering, and therefore, it is desirable that the impurity concentration be set $1 \times 10^{17}$ cm$^{-3}$ or less.

In this example, Ti/Al is used as the source electrode 407 and drain electrode 408. However, any metal which is capable of being in ohmic contact with AlGaN that is used as the ohmic contact layer 406 in this example may be employed for the source electrode and drain electrode. For instance, the metals such as W, Mo, Si, Ti, Pt, Nb, Al and Au may be used, and also a layered structure made with a plurality of metals may be used.

Similarly, in this example, Ni/Au is used as the gate metal 412. However, a desired metal may be used since the gate electrode is not in direct contact with the semiconductor layer according to the present invention. It is desirable that such a metal that does not react to the gate insulation film is used.

In this example, it is explained that the gate electrode 412 is formed so as to fill up the recess portion 410. However, there may be occurred a minute clearance between the gate electrode and a recess sidewall portion in the process of making it.

Further, as this example is the mode in which the electron is selected for the traveling carrier, it is formed in such a manner that an overhanging portion of the gate electrode is longer on the drain electrode side than that on the source electrode side. However, the overhanging portion on the source electrode side is not involved in the effects of the present invention so that it may also be equal to or longer than the overhanging portion on the drain electrode side. If the overhanging portion on the source electrode side becomes longer, such a demerit as reduction in the gain due to increase in gate capacity is significant, in contrast with the effects of improving the breakdown voltage and decreasing the current collapse. Therefore, it is desirable that the overhanging portion on the source electrode side be shorter than the overhanging portion on the drain electrode side.

In this example, the recess structure is formed by eliminating a portion of the first insulation film and the ohmic contact layer. A high gain can be obtained by shortening the distance between the gate electrode and the carrier traveling layer lying in the recess area. A high breakdown voltage can be realized by extending the gate electrode to the drain electrode side and thereby alleviating the concentration of the electric field on the drain electrode side.

On the other hand, in such a mode where a hole is selected as the traveling carrier, a region where the electric field concentrates is reverse to that in the mode where an electron is selected as the traveling carrier. Therefore, the side on which the overhanging portion of the gate electrode is provided is also reversed.

Fifth Embodiment

Figure 5:
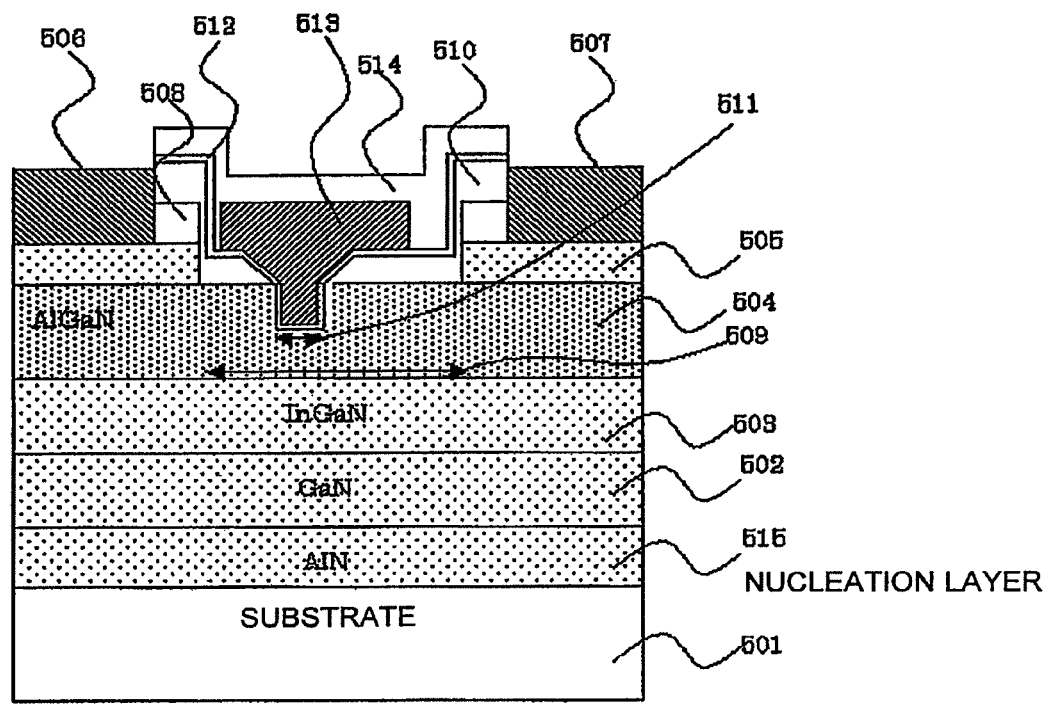
FIG. 5 is a sectional view showing the structure of the semiconductor device used for a fifth embodiment according to the present invention.
Figure 6:
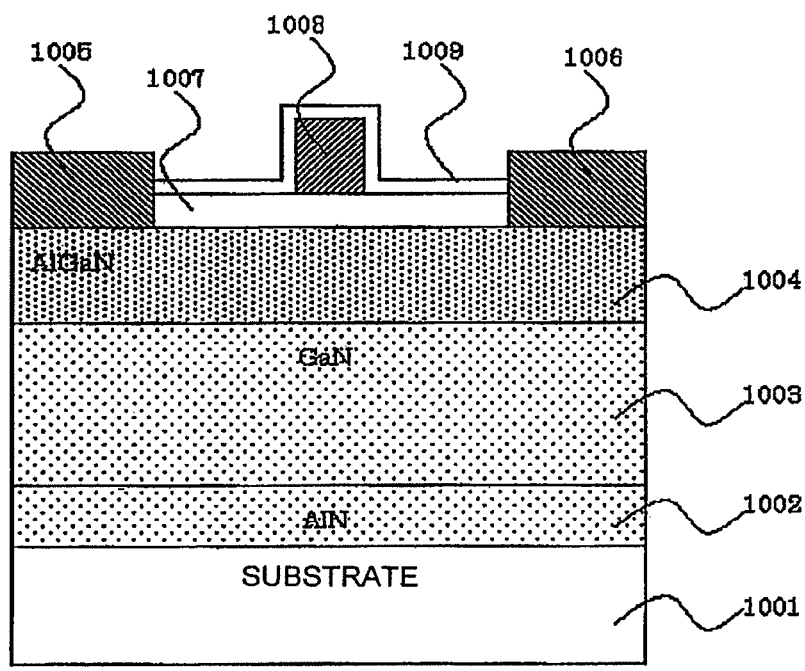
FIG. 6 is a sectional view showing the structure of the semiconductor device according to a conventional technology.

FIG. 5 illustrates an example of a fifth embodiment according to the present invention. FIG. 5 is a cross section structure diagram showing an embodiment of the present invention. In the field-effect transistor of this embodiment, a buffer layer 502 made of the first GaN-based semiconductor and a carrier traveling layer 503 made of the second GaN-based semiconductor, a carrier supplying layer 504 made of the third GaN-based semiconductor and the ohmic contact layer 505 made of the fourth GaN-based semiconductor is formed in series on a substrate 501.

Thereafter, a source electrode 506 and a drain electrode 508 are formed thereon, and then a first insulation film 508 is further deposited. After that, a part of the insulation film 508 and the ohmic contact layer 505 lying between the source electrode 506 and the drain electrode 507 are eliminated to form a first recess area 509. A second insulation film 510 is further formed, and then a part of the insulation film 510 lying in the recess area 509 is eliminated by isotropic etching or the like to be tapered. The carrier supplying layer 504 in the area where the opening is formed in the insulation film 509 is further eliminated so as to make up a second recess structure 511.

Next, a gate insulation film 512 is deposited thereon, the recess portion 511 is further embedded, and then a gate electrode 513 is formed so as to fill up the recess portion 511 and cover on over an area where the second insulation film 510 remains so that its portion on the drain electrode side is longer than that on the source electrode side. Lastly, a protective film 514 is deposited to make up the field-effect transistor.

As a material for the substrate 501 of this embodiment, there are exemplified sapphire, silicon carbide, GaN, AlN and the like.

As a material for the first GaN-based semiconductor 502, there are exemplified the III nitride semiconductors of GaN, InN and AlN and the GaN-based semiconductor alloy represented by $In_xAl_yGa_{1-x-y}N$ ($0 \leq x \leq 1$, $0 \leq y \leq 1$, $0 x+y \leq 1$) for instance. It is also possible, however, to insert a nucleation layer made of the III nitride semiconductors of GaN, InN and AlN or a GaN-based semiconductor alloy represented by $In_xAl_yGa_{1-x-y}N$ ($0 \leq x \leq 1$, $0 \leq y \leq 1$, $0 x+y \leq 1$) between the substrate 501 and the first semiconductor 502, which is helpful to form the first semiconductor. It is also possible to dope Si, S, Se and the like as n-type impurities, or Be, C, Mg and the like as p-type impurities into the first GaN-based semiconductor 502.

Further, as a material for the second GaN-based semiconductor 503, there are exemplified the III nitride semiconductors of GaN, InN or AlN and the GaN-based semiconductor alloy represented by $In_xAl_yGa_{1-x-y}N$ ($0 \leq x \leq 1$, $0 \leq y \leq 1$, $0 x+y \leq 1$) for instance. It is also possible to dope Si, S, Se and the like as n-type impurities, or Be, C, Mg and the like as p-type impurities into the second GaN-based semiconductor 503. However, when the impurity concentration in the second GaN-based semiconductor 503 becomes high, electron mobility lowers due to influence of Coulomb scattering, and thus it is desired that impurity concentration be set $1 \times 10^{17}$ cm$^{-3}$ or less.

In addition, as a material for the third GaN-based semiconductor 504, there are exemplified the III nitride semiconductors of GaN, InN or AlN as well as the GaN-based semiconductor alloy represented by $In_xAl_yGa_{1-x-y}N$ ($0 \leq x \leq 1$, $0 \leq y \leq 1$, $0 x+y \leq 1$) for instance. In this embodiment according to the present invention, however, chosen therefor is such a substance or a composition of which electron affinity is lower than that of the second GaN-based semiconductor 503. It is also possible to dope Si, S, Se and the like as n-type impurities, or Be, C, Mg and the like as p-type impurities into the third semiconductor 504.

Accordingly, it is desirable to form a hetero junction on an interface between the carrier traveling layer 503 made of the second GaN-based semiconductor and the carrier supplying layer 504 made of the third GaN-based semiconductor. When selecting an electron for a carrier traveling in the carrier traveling layer 303, it is desirable to make such a choice that conduction band energy Ec of the second GaN-based semiconductor is lower than the conduction band energy Ec of the third GaN-based semiconductor so as to have band discontinuity ΔEc existent. When selecting a hole for the carrier traveling in the carrier traveling layer 303, it is desirable to make such a choice that valence band energy Ev of the second GaN-based semiconductor is higher than the valence band energy Ev of the third GaN-based semiconductor so as to have the band discontinuity ΔEv existent.

As a material for the fourth GaN-based semiconductor 505, there are exemplified the III nitride semiconductors of GaN, InN or AlN as well as the GaN-based semiconductor alloy represented by $In_xAl_yGa_{1-x-y}N$ ($0 \leq x \leq 1$, $0 \leq y \leq 1$, $0 x+y \leq 1$) for instance. In this embodiment according to the present invention, however, chosen therefor should be such a substance or a composition which is different from the third GaN-based semiconductor. It is also possible to dope Si, S, Se and the like as n-type impurities, or Be, C, Mg and the like as p-type impurities into the forth semiconductor 505.

On the other hand, as a material for the first gate insulation film 508 and second gate insulation film 510, there is exemplified a substance consisting of one or more of Si, Mg, Hf, Al, Ti and Ta and one or more of O and N. As a material for the gate insulation film 512, there is exemplified a substance consisting of one or more of Si, Mg, Hf, Al, Ti and Ta and one or more of O and N.

As a material for the protective film 514, there is exemplified a substance consisting of one or more of Si, Mg, Hf, Al, Ti and Ta and one or more of O and N or an organic material.

Example 5

An example of the fifth embodiment according to the present invention will be presented below. The field-effect transistor of this example is constructed by using a c-plane ((0001) plane) silicon carbide (SiC) substrate as the substrate 501, an AlN layer (layer thickness: 200 nm) as the nucleation layer 515, a GaN layer (layer thickness: 2000 nm) as the first GaN-based semiconductor 502, an InGaN carrier traveling layer (composition ratio of In: 0.15, layer thickness: 15 nm) as the second GaN-based semiconductor 503, an AlGaN carrier supplying layer (composition ratio of Al: 0.25, layer thickness: 40 nm) as the third GaN-based semiconductor 504, a Si-doped GaN ohmic contact layer (layer thickness: 50 nm, doping level of Si: $1\times10^{19}$ cm$^{-3}$) as the fourth GaN-based semiconductor 505, Ti/Al (film thickness of the Ti layer: 10 nm, film thickness of the Al layer: 200 nm) as the source electrode 506 and drain electrode 507, a SiON film (film thickness: 80 nm) as the first insulation film 508, a part of the first insulation film eliminated by dry etching using an SF$_6$ gas and a part of the fourth GaN-based semiconductor 505 eliminated by dry etching using a mixed gas of BCl$_3$ and an SF$_6$ as a first recess 509, a SiON film (film thickness: 80 nm) as the second insulation film 510, a part of the second insulation film eliminated by dry etching using an SF$_6$ gas as isotropic etching and a part of the third GaN-based semiconductor 504 eliminated by 20 nm by dry etching using BCl$_3$ as a second recess 511, a SiON film (film thickness: 10 nm) as the gate insulation film 512, Ni/Au (film thickness of Ni layer: 10 nm, film thickness of Au layer: 200 nm) as the gate electrode 513, and a SiON film (film thickness: 50 nm) as the protective film 514, respectively.

Choice of such a structure allows only the distance between the electrodes and the carrier traveling layer lying directly beneath the gate electrode to be shortened by the recess, and thereby a high gain is obtained. At the same time, the distance between the surface of the semiconductors and the carrier traveling layer in the areas other than the recess area is so long that the carrier supplying layer is hardly subjected to the influence of a potential fluctuation of the SiON film/AlGaN interface, and so current collapse can also be suppressed. Furthermore, the ohmic contact layer being Si-doped to be of n-type is not adjacent to the gate electrode, and so a high breakdown voltage can be realized while maintaining low contact resistance.

Further, the portion of the gate electrode extended to the drain electrode side alleviates concentration of electric field on an edge of the gate electrode on the drain electrode side. Therefore, even if the gate insulation film is as thin as 10 nm, it can realize dielectric breakdown voltage of 200 V or higher. Furthermore, in this example, as selective etching between the GaN ohmic contact layer and the AlGaN carrier supplying layer can be carried out, the depth of the first recess is well controlled, which can improve in-plane uniformity and reproducibility.

In this example, SiC is employed as the substrate. However, any other substrate such as sapphire may be used. Furthermore, in this example, the c-plane ((0001) plane) of the SiC substrate is used. However, any plane on which the GaN-based semiconductor is grown in c-axis-oriented manner so as to generate a piezoelectric effect in the same direction as this embodiment may be also employed. The plane to be used may be inclined up to approximately 55° in any direction. It is preferable, however, to incline it within 10° in an arbitrary direction because a larger inclination makes it difficult to obtain a good crystalline property.

Similarly, in this example, the InGaN layer which has In composition ratio of 0.15 is employed as the carrier traveling layer. However, it is possible, as for the carrier traveling layer, to use the III nitride semiconductors of GaN, InN or AlN as well as a GaN-based semiconductor alloy represented by In$_x$Al$_y$Ga$_{1-x-y}$N ($0 \leq x \leq 1$, $0 \leq y \leq 1$, $0 x+y \leq 1$). In order to accumulate carriers therein, It is preferable that a band gap width of the semiconductor to be used for the carrier traveling layer be at least narrower than the band gap width of the carrier supplying layer.

Similarly, as for the film thickness of each of the layers, a desired film thickness may be set. However, a lattice constant of each of the second, third, forth and fifth layers is different from the lattice constant of the first layer, and so it is preferable that the film thickness thereof be set no thicker than its critical film thickness at which a misfit dislocation could be generated.

In this example, any impurities are not doped into the InGaN carrier traveling layer. However, it may be doped with Si, S, Se and the like as the n-type impurities or with Be, C and the like as the p-type impurities. However, when the impurity concentration in the carrier traveling layer becomes high, the electron mobility lowers due to influence of the Coulomb scattering, and therefore, it is desirable that the impurity concentration be set $1\times10^{17}$ cm$^{-3}$ or less.

In this example, Ti/Al is used as the source electrode 506 and drain electrode 507. However, any metal which is capable of being in ohmic contact with GaN that is used as the ohmic contact layer 505 in this example may be employed for the source electrode and drain electrode. For instance, the metals such as W, Mo, Si, Ti, Pt, Nb, Al and Au may be used, and also a layered structure made with a plurality of metals may be used.

Similarly, in this example, Ni/Au is used as the gate metal 513. However, a desired metal may be used since the gate electrode is not in direct contact with the semiconductor layer according to the present invention. It is desirable that such a metal that does not react to the gate insulation film is used.

In this example, 20 nm thickness of the third GaN-based semiconductor is eliminated when making the second recess structure. However, the thickness of the semiconductor to be eliminated for forming the recess may be chosen in an arbitrary thickness, and thus it is possible to eliminate up to the thickness of the third GaN-based semiconductor. If the semiconductor thickness to be eliminated is thin, it reduces the effects of the recess structure of improving the breakdown voltage and decreasing the current collapse. If the semiconductor thickness to be eliminated is thick, the increase in the resistance is caused by the reduction of the carriers lying under the gate. Therefore, it is preferable that the semiconductor thickness to be eliminated be 30% to 90% t of the originally formed semiconductor thickness.

In this example, it is explained that the gate electrode 513 is formed so as to fill up the second recess portion 511. However, there may be occurred a minute clearance between the gate electrode and a recess sidewall portion in the process of making it.

Further, as this example is the mode in which the electron is selected for the traveling carrier, it is formed in such a manner that an overhanging portion of the gate electrode is longer on the drain electrode side than that on the source electrode side. However, the overhanging portion on the source electrode side is not involved in the effects of the present invention so that it may also be equal to or longer than the overhanging portion on the drain electrode side. If the overhanging portion on the source electrode side becomes longer, such a demerit as reduction in the gain due to increase in gate capacity is significant, in contrast with the effects of improving the breakdown voltage and decreasing the current collapse. Therefore, it is desirable that the overhanging portion on the source electrode side be shorter than the overhanging portion on the drain electrode side.

In this example, the recess structure is formed by eliminating a part of the second insulation film and the carrier supplying layer. A high gain can be obtained by thinning the carrier supplying layer lying in the recess area. A high breakdown voltage can be realized by extending the gate electrode to the drain electrode side and thereby alleviating the concentration of electric field on the drain electrode side.

On the other hand, in such a mode where a hole is selected as the traveling carrier, a region where the electric field concentrates is reverse to that in the mode where an electron is selected as the traveling carrier. Therefore, the side on which the overhanging portion of the gate electrode is provided is also reversed.

The present invention is concretely explained above by referring to the examples. However, the present invention is not limited to the modes of the aforementioned examples. It goes without saying that various modifications may be made without departing from the scope of the invention. For instance, it is illustrated that the first insulation film, second insulation film and gate insulation film are formed by a substance consisting of one or more of Si, Mg, Hf, Al, Ti and Ta and one or more of O and N. It is also illustrated that the protective film is formed by a substance consisting of one or more of Si, Mg, Hf, Al, Ti and Ta and one or more of O and N or an organic material. It is also possible, however, to form the first insulation film, second insulation film, gate insulation film and protective film with such a layered film composed of two or more kinds of the layers out of the above films.

The invention claimed is:

1. A semiconductor device characterized in that:
the semiconductor device is a field-effect transistor made of a III-V nitride semiconductor that comprises an insulation film between a gate electrode and a III-V nitride semiconductor layer;
the field-effect transistor has a recess structure that is formed by eliminating a part of the III-V nitride semiconductor layer; and
the gate electrode and the insulation film are placed in a part or all of the recess area,
wherein the insulation film comprises at least a gate insulation film,
wherein the gate electrode is formed only on the gate insulation film,
wherein a thickness of the insulation film placed between the gate electrode and the semiconductor layer comprises at least a thickness of the gate insulation film,
wherein the insulation film placed on the area other than the recess area comprises at least one of a first insulation film and a second insulation film as well as the gate insulation film;
wherein the gate insulation film placed on the area other than the recess area is formed on the first insulation film or the second insulation film placed on the area other than the recess area,
wherein the first insulation film or the second insulation film placed on the area other than the recess area, on which the gate insulation film placed on the area other than the recess area is formed, is underlying below the gate insulation film,
wherein the gate insulation film placed on the area other than the recess area is out of contact with the III-V nitride semiconductor layer, and
wherein a material used for the first insulation film or the second insulation film is an insulating substance consisting of one or more of Si, Mg, Hf, Al, Ti and Ta and one or more of O and N.

2. A semiconductor device as claimed in claim 1, wherein the thickness of the insulation film placed between the gate electrode and the III-V nitride semiconductor layer changes in two or more steps.

3. A semiconductor device as claimed in claim 1, wherein the thickness of the insulation film placed between the gate electrode and the III-V nitride semiconductor layer changes continuously.

4. A semiconductor device as claimed in claim 1, wherein the film thickness of the insulation film placed in the recess area is always thinner than the film thickness of the insulation film placed on the area other than the recess area.

5. A semiconductor device as claimed in claim 1 or 4, wherein
the III-V nitride semiconductor layer comprises a carrier traveling layer or a carrier supplying layer made of the III-V nitride semiconductor; and
the recess structure is formed by eliminating 30% to 90% of the thickness of the carrier traveling layer or of the carrier supplying layer made of the III-V nitride semiconductor.

6. A semiconductor device as claimed in claim 1, wherein the gate electrode portion other than the part of the gate electrode that is most adjacent to the semiconductor layer is longer on a drain electrode side than on a source electrode side.

7. A semiconductor device as claimed in claim 1, wherein a material used for the gate insulation film is always an insulating substance consisting of one or more of Si, Mg, Hf, Al, Ti and Ta and one or more of O and N.

8. A semiconductor device characterized in that:
the semiconductor device is a field-effect transistor made of a III-V nitride semiconductor that comprises an insulation film between a gate electrode and a III-V nitride semiconductor layer;
the field-effect transistor has a recess structure that is formed by eliminating a part of the III-V nitride semiconductor layer; and
the gate electrode and the insulation film are placed in a part or all of the recess area,
wherein the insulation film comprises at least a gate insulation film,
wherein, in the recess area, only the gate insulation film is present between the gate electrode and the bottom portion of the recess structure and between the gate electrode and the sidewall portion of the recess structure, and
wherein the gate insulation film placed on the area other than the recess area is out of contact with the III-V nitride semiconductor layer.

9. A semiconductor device as claimed in claim 8, wherein, in the recess area, the recess portion is filled up with the gate electrode and the gate insulation film, and
wherein, in the recess area, the gate insulation film is in contact with the III-V nitride semiconductor layer, whereas the gate insulation film placed on the area other than the recess area is out of contact with the III-V nitride semiconductor layer.

10. A semiconductor device as claimed in claim 8, wherein the insulation film placed on the area other than the recess area comprises a first insulation film or a second insulation film as well as the gate insulation film, and
   wherein the gate insulation film placed on the area other than the recess area is formed on the first insulation film or the second insulation film placed on the area other than the recess area, and
   wherein the first insulation film or the second insulation film placed on the area other than the recess area, on which the gate insulation film placed on the area other than the recess area is formed, is underlying below the gate insulation film.

11. A semiconductor device as claimed in claim 8, wherein the thickness of the insulation film placed between the gate electrode and the III-V nitride semiconductor layer changes in two or more steps.

12. A semiconductor device as claimed in claim 8, wherein the thickness of the insulation film placed between the gate electrode and the III-V nitride semiconductor layer changes continuously.

13. A semiconductor device as claimed in claim 8, wherein the film thickness of the insulation film placed in the recess area is always thinner than the film thickness of the insulation film placed on the area other than the recess area.

14. A semiconductor device as claimed in claim 8, wherein the III-V nitride semiconductor layer comprises a carrier traveling layer or a carrier supplying layer made of the III-V nitride semiconductor; and
   wherein the recess structure is formed by eliminating 30% to 90% of the thickness of the carrier traveling layer or of the carrier supplying layer made of the III-V nitride semiconductor.

15. A semiconductor device as claimed in claim 8, wherein the gate electrode portion other than the part of the gate electrode that is most adjacent to the semiconductor layer is longer on a drain electrode side than on a source electrode side.

16. A semiconductor device as claimed in claim 8, wherein a material used for the gate insulation film is always an insulating substance consisting of one or more of Si, Mg, Hf, Al, Ti and Ta and one or more of O and N.

17. A semiconductor device as claimed in claim 10, wherein a material used for the gate insulation film is always an insulating substance consisting of one or more of Si, Mg, Hf, Al, Ti and Ta and one or more of O and N.

18. A semiconductor device as claimed in claim 10, wherein a material used for the first insulation film or the second insulation film is an insulating substance consisting of one or more of Si, Mg, Hf, Al, Ti and Ta and one or more of O and N.

* * * * *

UNITED STATES PATENT AND TRADEMARK OFFICE
CERTIFICATE OF CORRECTION

PATENT NO.         : 7,859,014 B2
APPLICATION NO.    : 11/571290
DATED              : December 28, 2010
INVENTOR(S)        : Tatsuo Nakayama et al.

It is certified that error appears in the above-identified patent and that said Letters Patent is hereby corrected as shown below:

Column 9, Line 26: Delete "55" and insert -- 55° --, therefor

Column 9, Line 27: Delete "10" and insert -- 10° --, therefor

Signed and Sealed this
Sixteenth Day of October, 2012

David J. Kappos
*Director of the United States Patent and Trademark Office*